United States Patent [19]

Tegge, Jr.

[11] 4,203,127

[45] May 13, 1980

[54] PACKAGE AND METHOD OF PACKAGING SEMICONDUCTOR WAFERS

[75] Inventor: Bruce R. Tegge, Jr., Scottsdale, Ariz.

[73] Assignee: Motorola, Inc., Schaumburg, Ill.

[21] Appl. No.: 17,202

[22] Filed: Mar. 2, 1979

Related U.S. Application Data

[63] Continuation of Ser. No. 816,778, Jul. 18, 1977, abandoned.

[51] Int. Cl.² ............ H01L 29/06; H01L 23/02; H01L 23/12
[52] U.S. Cl. .................. 357/55; 357/74; 357/81; 29/413; 29/588
[58] Field of Search ............. 357/55, 74, 81; 29/413, 29/588

[56] References Cited

U.S. PATENT DOCUMENTS

| | | | |
|---|---|---|---|
| 3,040,489 | 6/1962 | Decosta | 29/413 |
| 3,112,850 | 12/1963 | Garibotti | 357/55 |
| 3,396,452 | 8/1968 | Sato et al. | 357/55 |
| 3,461,537 | 8/1969 | Lotz | 357/55 |
| 3,537,169 | 11/1970 | Eigeman | 357/55 |
| 3,537,603 | 11/1970 | Willis | 29/413 |
| 3,559,855 | 2/1971 | Barnett | 29/413 |
| 3,562,058 | 2/1971 | Boyd | 29/413 |
| 3,606,035 | 9/1971 | Gantley | 29/413 |
| 3,707,760 | 1/1973 | Citrin | 29/413 |
| 3,762,973 | 10/1973 | Gabrail | 357/55 |

Primary Examiner—Andrew J. James
Attorney, Agent, or Firm—John A. Fisher

[57] ABSTRACT

A package and a method of packaging semiconductor devices, especially in expanded wafer form. The package is formed by sticking an adhesive backed ring to the plastic sheet upon which the expanded wafer is affixed so that the ring surrounds the wafer. The adhesive backed ring holds the plastic sheet securely and protects the surface of the wafer. The package is completed by covering the wafer with a second protective sheet and vacuum sealing in a plastic bag.

3 Claims, 2 Drawing Figures

PACKAGE AND METHOD OF PACKAGING SEMICONDUCTOR WAFERS

This is a continuation of application Ser. No. 816,778, filed July 18, 1977 and now abandoned.

BACKGROUND

This invention relates to the packaging of semiconductor devices, and more particularly to a package and a method for storing, assembling, or shipping semiconductor devices in expanded wafer format.

Semiconductor devices, including diodes, transistors, and integrated circuits are fabricated in large arrays of similar die on semiconductor wafers. After the processing of the semiconductor wafer is completed, the devices are tested electrically and reject die are inked for later discarding. The wafer is then scribed or sawed to separate the individual devices. The scribed or sawed wafers, now divided into individual devices, are stored, at least temporarily, before the individual die are assembled in discrete packages or hybrid assemblies. The dice may also be shipped to another location for assembly or sold as unassembled dice for eventual assembly by the end user.

There are a number of packages or containers and techniques commercially available for storing and shipping dice, but they all suffer from one or more shortcomings. With one of these, the plastic sheet upon which the wafer was scribed and broken is held about its edges by a clamping arrangement. The dice stick to the plastic sheet by electrostatic, mechanical, or adhesive forces and maintain the same approximate orientation as in the unscribed wafer. A metal plate is forced up under the plastic sheet causing the sheet to stretch. As the sheet stretches, the dice sticking to it are spread apart. The plastic sheet is then held in this stretched state by a plastic ring which fits securely about the edges of the metal plate. With the dice spread apart, the so called "expanded wafer" is convenient for handling in subsequent operations such as die bonding or visual inspection. For protection during storage, the top surface of the wafer can be covered with a sheet of plastic or other protective material. The container is thus comprised of metal plate, plastic sheet, securing ring, and the protective top sheet. This container has at least two disadvantages. First, it is expensive and second, it is bulky, being four to five inches in diameter and about one-half inch in thickness. It is inconvenient for shipping because it is heavy and has no provision for sealing the dice in the container.

Because the aforementioned container is not suitable for storage or shipping, it is common to use, in addition, a second container or die pack. A die pack is a plastic tray provided with an array of depressions of the same approximate size as the individual die to be stored. An operator transfers the un-inked dice from the expanded wafer to the die pack using tweezers or a vacuum pick up. The dice are held in place by enclosing the die pack with a tightly fitting lid. Although the die pack is a good shipping or storage container, loading the die pack is an expensive and time-consuming operation, especially when it is recalled that the dice to be stored may be only a few tens of mils on a side. It is difficult to carry out the transfer operation without damaging any of the die and without disturbing the relative geometrical orientation.

Another container technique is disclosed in U.S. Pat. No. 3,562,058. A vacuum apparatus is employed to stretch a wafer supporting plastic sheet thereby forming an expanded wafer. The plastic sheet can be held in the stretched state by vacuuming the sheet down upon a cup shaped disc covered on its upper surface with a pressure sensitive adhesive. Again, this container suffers from the same deficiencies as the first mention container. No provision is made for protecting the sensitive top surface of the dice.

Accordingly, in view of the above stated deficiencies, a need existed for an inexpensive packaging system which can be used easily and conveniently for storing, assembling, or shipping dice.

SUMMARY OF THE INVENTION

It is an object of this invention to provide a package which can be used for shipping, assembling, or storing semiconductor dice. The package is inexpensive, lightweight, rigid enough to prevent physical damage to the dice, and can be sealed to protect the dice from contamination.

It is a further object of this invention to provide a process for packaging semiconductor dice especially in the form of an expanded wafer for shipping, assembly, or storage. The process provides for rapid and efficient loading of dice into a suitable container.

These objects may be attained by use of the novel circle package herein disclosed. The wafer or wafer portion to be packaged is placed on a sheet of plastic which is stretched to expand the wafer. The sheet is maintained in this stretched state by affixing an adhesive backed ring to the sheet. The adhesive backed ring surrounds the wafer, providing protection to the wafer and holding it in its expanded form. If necessary, the ring and wafer can be covered by a protective sheet and the whole structure sealed in a vacuum evacuated plastic bag.

The nature and use of this circle package will better understood from a consideration of the following detailed description taken in connection with the drawings.

DETAILED DESCRIPTION

Figure 1:
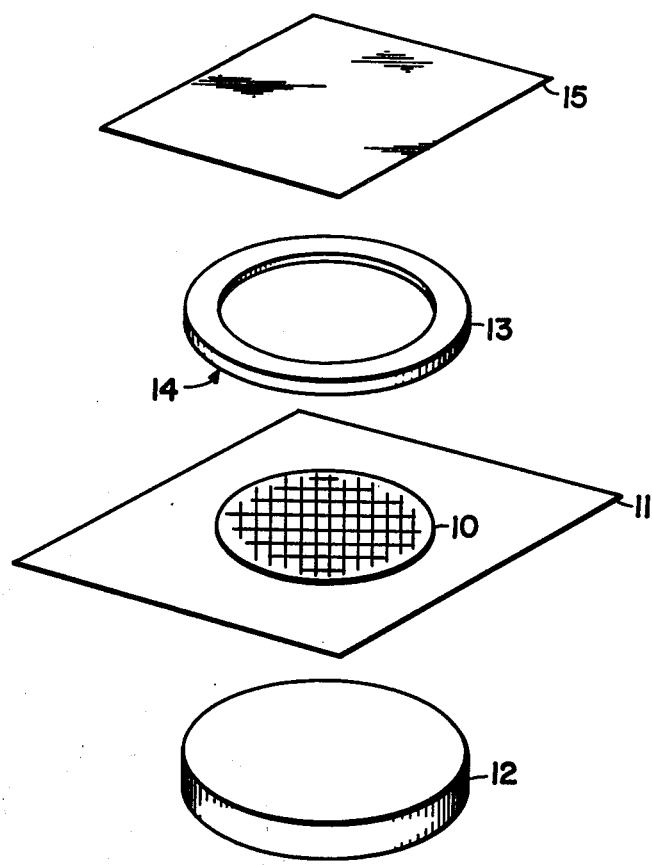
FIG. 1 is an exploded view showing the invention and the manner in which it can be employed.
Figure 2:
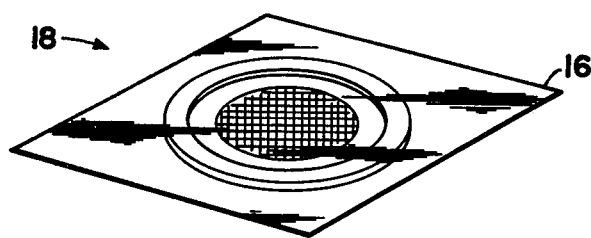
FIG. 2 shows the completed container with an enclosed wafer.

In FIG. 1 a semiconductor wafer 10, which has been scribed and broken to separate it into a number of individual die, is placed on a sheet of stretchable plastic 11. The individual die of the wafer 10 stick to the sheet 11 by electrostatic forces, or can be embedded in the sheet by pressing them lightly into the surface of the sheet. Alternatively, the sheet can be provided with a light adhesive layer for holding the dice. The sheet 11 can be held in a horizontal position by a clamping arrangement (not shown) which holds the sheet tightly by its edges. A metal plate 12 is then forced up under the plastic sheet 11 causing the sheet to stretch. As the sheet 11 stretches, the dice of the scribed and broken wafer 10 are spread apart slightly because they are sticking to the stretching sheet 11. In so doing, the wafer is expanded, but the dice maintain their same general position and same geometrical orientation. In prior art techniques, the expanded wafer 10 on the stretched plastic sheet 11 would be held in this configuration by placing a tightly fitting ring (not shown) around the edges of the metal plate 12 securing the edges of the plastic sheet 11 against the sides of metal plate 12. In the present invention, the stretched plastic sheet 11 is held in its stretched state by contacting the sheet 11 with an adhesive backed ring 13. The ring 13, provided with an adhesive coating on its underside 14, is pressed firmly down on the sheet 11. The adhesive backed ring 13 sticks securely to the stretched sheet 11 and holds it in its stretched state. Holding the sheet in this stretched state maintains the wafer in its expanded form. The excess portions of the sheet 11 extending outward from the ring 13 can be trimmed off with a knife or scissors. A sheet of plastic 15 or other protective material may be placed over the top of the expanded wafer 10 and ring 13 to protect the top surfaces of the dice of wafer 10. The bottom plastic sheet 11, wafer 10, ring 13, and the plastic sheet 15 can then be sealed in a vacuum evacuated plastic envelope 16 for shipping or storage. The completed container 18 is shown in FIG. 2. The ring 13 can be of any plastic, light metal or rigid fiber material. To accomodate a two-inch diameter semiconductor wafer or a portion of a larger wafer, the ring could have, for example, an inner diameter of 2.75 inches and an outer diameter of 3.25 inches. The thickness must be such, depending on the material from which the ring is made, that the ring will be rigid enough to stay approximately flat and provide protection to the expanded wafer contained therein. The ring can be, for example, about one-eighth inch in thickness. The one-eighth inch of thickness provides enough height above the delicate upper surface of the expanded wafer to allow a number of similarly packaged wafers to be stacked together without damage.

A number of options are available in using the circle pack. After the adhesive backed ring 13 has been affixed to the plastic sheet 11 and the excess plastic trimmed from around the ring, the expanded wafer is ready for inspection, die bonding, or the like, if so desired. The inspection station or die bonder can be equipped to accept and hold the circle package directly. Thus, the circle package presents the expanded wafer for immediate operations without requirements for further handling.

If the wafer 10 is to be stored for some period of time or shipped to another location, the package can be completed by covering the wafer 10 with the protective sheet 15 and then vacuum sealing the whole assembly in a plastic bag 16. So sealed, the expanded wafer 10 is protected, both from the ambient and from physical damage. The dice continue to stick to the plastic sheet 11 and maintain their same relative geometrical orientation during the storage period. When needed, the evacuated plastic bag 16 can be cut away to expose the expanded wafer. If only a few dice are needed, they can be removed from the circle package and the remainder can be resealed in another vacuum sealed bag.

Thus, it is apparent that there has been provided in accordance with the invention an improved package and method for the storing or shipping of semiconductor devices in expanded wafer form.

What is claimed is:

1. A package for a semiconductor wafer or a portion thereof wherein said wafer is comprised of a plurality of separate and individual die, said package comprised of:
    a first sheet having a surface to contact a first surface of the semiconductor wafer;
    an adhesive backed ring affixed to said surface of said first sheet and positioned to surround said semiconductor wafer, said ring having a thickness sufficient to extend above and protect said semiconductor wafer and sufficient to remain rigid and approximately flat; and
    a second sheet to cover a second surface of said semiconductor wafer.

2. A package for a semiconductor wafer which comprises:
    a first sheet having a surface to contact a first surface of the semiconductor wafer;
    an adhesive backed ring of about one-eighth inch in thickness, said ring affixed to said surface of said first sheet and positioned to surround said semiconductor wafer and extending above said semiconductor wafer; and
    a second sheet to cover a second surface of said semiconductor wafer.

3. A package for storing and protecting semiconductor dice in the form of an expanded wafer which comprises:
    a first sheet of a stretchable material for contacting a first surface of said dice, said first sheet in a stretched state to separate said dice;
    an adhesive backed ring affixed to said first sheet and positioned to surround said dice, said ring having sufficient thickness to extend above said dice and to provide sufficient rigidity to remain approximately flat while maintaining said first sheet in said stretched state; and
    a second sheet to cover a second surface of said dice.

* * * * *